United States Patent [19]

Young

[11] Patent Number: 5,498,905
[45] Date of Patent: Mar. 12, 1996

[54] LAYERED FEATURES FOR CO-FIRED MODULE INTEGRATION

[75] Inventor: Brian D. Young, Austin, Tex.

[73] Assignee: Hughes Aircraft Company, Los Angeles, Calif.

[21] Appl. No.: 296,392

[22] Filed: Aug. 26, 1994

[51] Int. Cl.$^6$ .............................. H01L 23/32; H05K 1/14
[52] U.S. Cl. ........................ 257/700; 257/727; 174/253; 361/783
[58] Field of Search .................................. 257/700, 727, 257/723; 361/732, 762, 783, 795; 174/253

[56] References Cited

U.S. PATENT DOCUMENTS

| | | | |
|---|---|---|---|
| 4,879,588 | 11/1989 | Ohtsuka et al. | 257/664 |
| 4,882,657 | 11/1989 | Braun | 361/784 |
| 5,051,869 | 9/1991 | Goldfarb | 361/752 |
| 5,136,471 | 8/1992 | Inasaka | 174/255 |
| 5,245,216 | 9/1993 | Sako | 257/676 |
| 5,303,119 | 4/1994 | Hilbrink | 361/749 |
| 5,397,916 | 3/1995 | Normington | 257/686 |
| 5,399,898 | 3/1995 | Rostoker | 257/499 |

*Primary Examiner*—Donald T. Hajec
*Assistant Examiner*—Mark S. Tremblay
*Attorney, Agent, or Firm*—Leonard A. Alkov; W. K. Denson-Low

[57] ABSTRACT

A unitized multilayer circuit structure that includes a plurality of planar dielectric insulating layers stacked in laminar fashion to form a substrate having sides formed by edges of the dielectric insulating layers and recessed regions formed in one or more one sides of the substrate for use in attaching the unitized multilayer circuit structure to a higher level assembly or for attaching electrical contact circuitry to the unitized multilayer circuit structure.

4 Claims, 2 Drawing Sheets

5,498,905

1
LAYERED FEATURES FOR CO-FIRED MODULE INTEGRATION

BACKGROUND OF THE INVENTION

The subject invention is directed generally to unitized multilayer circuit structures, and more particularly to a unitized multilayer circuit structure that includes integrally formed mechanical features that facilitate the installation of the unitized multilayer circuit structure.

Hybrid multilayer circuit structures, also known as hybrid microcircuits, implement the interconnection and packaging of discrete circuit devices, and generally include a unitized multilayer circuit structure formed from a plurality of integrally fused insulating layers (e.g., ceramic layers) having conductor traces disposed therebetween. The discrete circuit devices (e.g., integrated circuits) are commonly mounted on the top insulating layer so as not to be covered by another insulating layer or on a insulating layer having die cutouts formed thereon to provide cavities for the discrete devices. Passive components such as capacitors and resistors can be formed on the same layer that supports the discrete devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive material, whereby the conductive material is in contact with predetermined conductive traces between the layers that extend over or under the vias.

Unitized multilayer circuit structures are commonly made pursuant to co-fired technology wherein a unitized multilayer circuit module is made from layers of pyrolyzable dielectric tape (comprising for example a ceramic material) known in the art as "green tape". Generally, each of the green tape layers of a particular module is punched and screen printed to include a predetermined pattern of conductive vias, interconnecting conductive traces, and electrical components such as resistors and capacitors, or portions of capacitors. The individual screen printed green tape layers for a module are then stacked in the required order, and laminated together using a chosen temperature and pressure. The laminated structure is then fired at an elevated temperature. Such co-fired technology has been implemented with low temperature co-fired ceramic (LTCC) as well as with high temperature co-fired ceramic (HTCC).

Examples of low temperature co-fired processing can be found in "Development of a Low Temperature Co-fired Multilayer Ceramic Technology," by William A. Vitriol et al., 1983 ISHM Proceedings, pages 593–598; "Processing and Reliability of Resistors Incorporated Within Low Temperature Co-fired Ceramic Structures," by Ramona G. Pond et al., 1986 ISHM Proceedings, pages 461–472; and "Low Temperature Co-Fireable Ceramics with Co-Fired Resistors," by H. T. Sawhill et al., 1986 ISHM Proceedings, pages 268–271.

A unitized multilayer circuit structure is commonly integrated into higher level assemblies by soldering or bolting the unitized circuit structure into place, and attachments thereto are achieved by soldering, gluing, or welding. A consideration with such techniques is the requirement of complex robotics and/or heat. Moreover, such securing and attachment techniques typically require alignment mechanisms that are separate from the securing and attachment mechanisms.

2
SUMMARY OF THE INVENTION

It would therefore be an advantage to provide a unitized multilayer circuit structure that is efficiently integrated into higher level assemblies.

Another advantage would be to provide a unitized multilayer circuit structure that is secured and aligned into a higher level assembly by an integral mechanism.

The foregoing and other advantages are provided by the invention in a unitized multilayer circuit structure that includes a plurality of planar dielectric insulating layers stacked in laminar fashion. These stacked layer form a substrate having sides formed by edges of the dielectric insulating layers recessed regions formed in one or more one sides of the substrate for use in attaching the unitized multilayer circuit structure to a higher level assembly. It can also be used for attaching electrical contact circuitry to the unitized multilayer circuit structure.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1A:
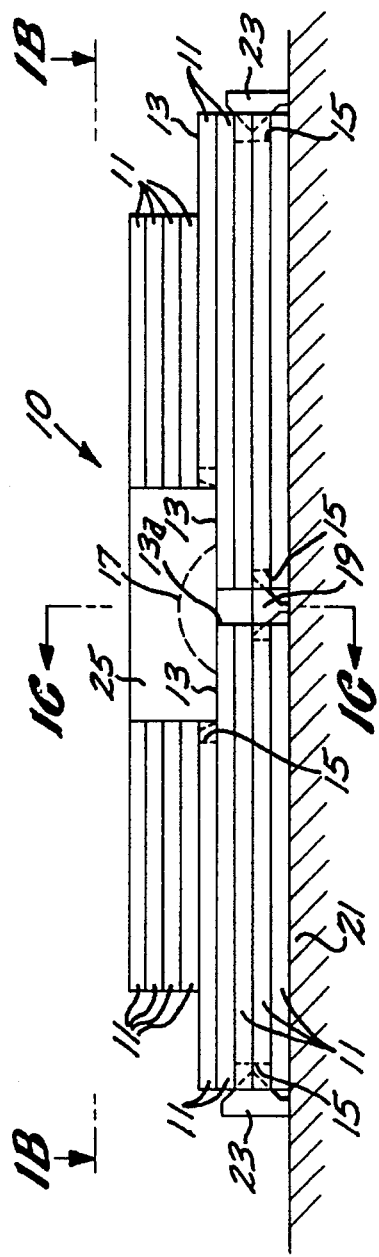
FIG. 1A is a side elevation view illustrating co-fired multilayer circuit structures that includes layered features in accordance with the invention.

In the following detailed description and in the several figures of the drawing, like elements are identified with like reference numerals.

The subject invention is implemented in a unitized multilayer circuit structure that is utilized for interconnecting various discrete circuits mounted on the outside of the unitized structure. The unitized multilayer circuit structure is formed from a plurality of dielectric layers (comprising ceramic, for example), conductive traces disposed between the layers, and conductive vias formed in the layers which together with any buried elements (e.g., elements formed on the top of a dielectric layer and covered by an overlying dielectric layer) are processed to form an integrally fused unitized multilayer structure. After the unitizing fabrication, appropriate metallization, including for example ground plane metallization, is applied to the outside of the unitized structure, and the discrete circuits are mounted and electrically connected.

Figure 1B:
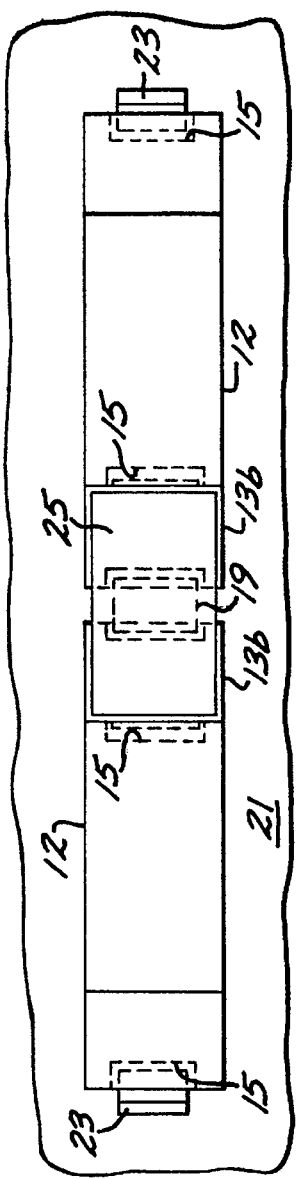
FIG. 1B is a top plan view of the co-fired multilayer circuit structures of FIG. 1A.

Referring now to FIGS. 1A and 1B, set forth therein are simplified schematic elevation and plan views of first and second unitized multilayer circuit structures 10 that are mirror images of each other and include layered features in accordance with the invention that are useful in integrating the unitized multilayer circuit structures into a higher level assembly. In particular, each unitized multilayer circuit structure 10 is comprised of a plurality of planar dielectric layers 11 stacked in laminar fashion to form a substrate having sides 12 formed by edges of the dielectric insulating layers. The substrates are shown for illustrative purposes as being end to end, and steps 13 are formed at each end of each unitized multilayer circuit structure 10, such that one step from one substrate is facing a corresponding step from the other substrate. Each step includes a forward edge 13a and side edges 13b.

Recesses 15 are formed in the opposing sides of each substrate that are below the steps 13, as well as in each of the sides of the substrates above the respective steps 13 that face each other. Contacts are disposed on the respective steps that face each other, and are interconnected by wire bonds 17.

By way of illustrative example, the recesses 15 that are below the steps that face each other are engaged with a projection of a rigid post 19 that is secured to a base 21 of a higher assembly. The recesses below the steps on the other ends of the substrates are engaged by tapered projections of respective resilient snap fasteners 23 that are secured to the base 21. Each substrate is attached to the base 21, for example, by engaging one end of the substrate to the projection of the rigid post 19 and then pushing the other end of the substrate toward the base 21 to engage the tapered projection of one of the snap fasteners 23 into the recess 15 that located at such end.

By way of illustrative example, the recesses that are above the steps that face each other accept the tapered projections of a snap-in cap 25 that is snapped into place over the wire bonds and the contacts disposed on the substrate steps that face each other.

In accordance with the invention, the steps are formed by utilizing shorter ceramic tape layers for the layers that are above the steps, and the recesses 15 are formed by cutting or punching openings along corresponding edges of the ceramic tape layers in which the recesses are to be formed.

Figure 1C:
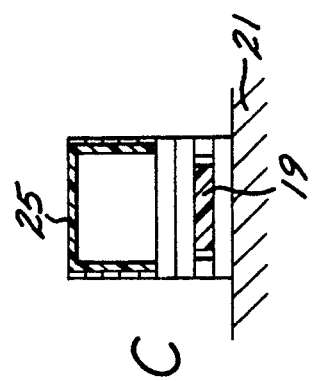
FIG. 1C is an end elevational view of one of the co-fired multilayer circuit structures of FIG. 1A.
Figure 2A:
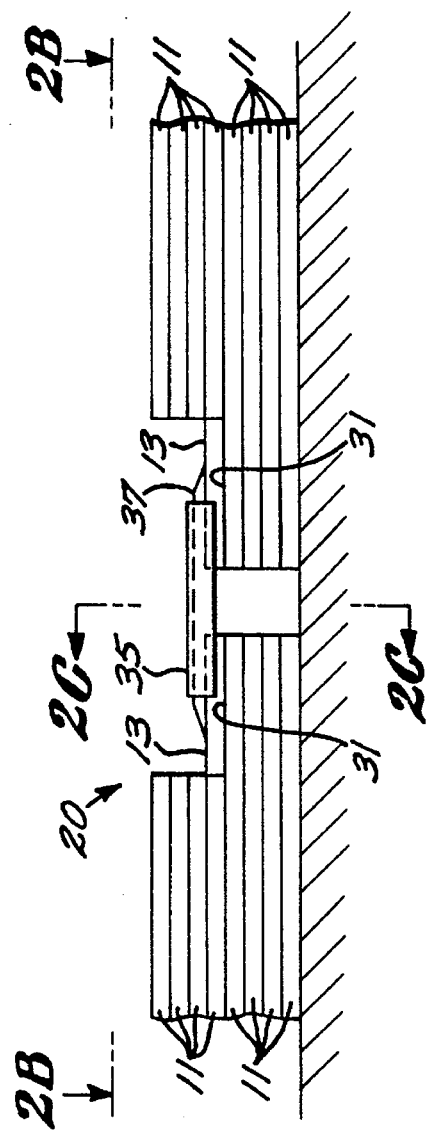
FIG. 2A is a side elevation view illustrating co-fired multilayer circuit structures that includes further layered features in accordance with the invention.
Figure 2B:
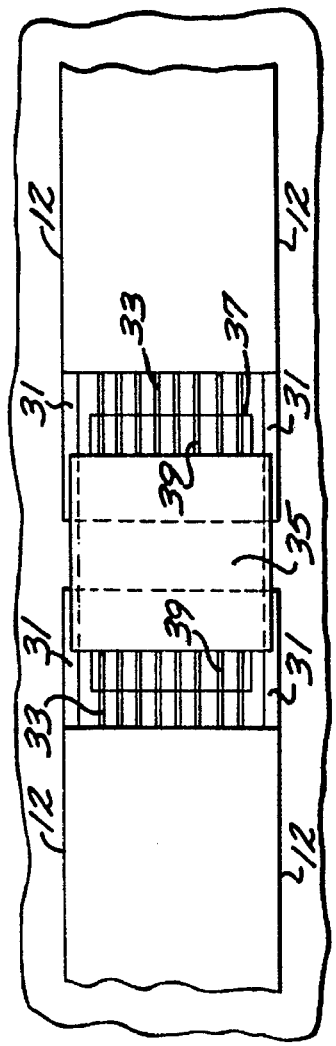
FIG. 2B is a top plan view of the co-fired multilayer circuit structures of FIG. 2A.
Figure 2C:
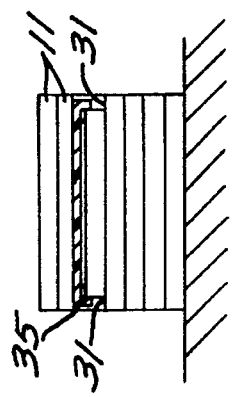
FIG. 2C is an end elevational view of one of the co-fired multilayer circuit structures of FIG. 2A.

Referring now to FIGS. 2A and 2B, set forth therein are simplified schematic elevation and plan views of first and second unitized multilayer circuit structures 20 that are mirror images of each other and include further layered features in accordance with the invention that are useful in integrating the unitized multilayer circuit structures into a higher level assembly. In particular, each unitized multilayer circuit structure 20 is similar to the unitized multilayer circuit structure 10 of FIG. 1 and is comprised of a plurality of planar dielectric layers 11 stacked in laminar fashion to form a substrate having sides formed by edges of the dielectric insulating layers. The substrates are shown for illustrative purposes as being end to end, and steps 13 are formed at the ends of the substrates that are next to each other, such that one step from one substrate is facing a corresponding step from the other substrate. Each step includes a forward edge 13a and side edges, and grooves 31 are formed in each of the side edges of the inwardly facing steps of the unitized circuit structures 20. While not shown, the multilayer circuit structures 20 can have recesses similar to the recesses 15 shown in FIGS. 1A and 1B for attachment thereof to a base of a higher level assembly as described above relative to the structures 10 of FIGS. 1A and 1B.

Metal traces 33 are disposed on the inwardly facing steps 13, and a tape 37 having metal traces 39 formed thereon spans the inwardly facing steps 13. A carrier element 35 is attached to the tape 37, and functions to laterally align the metal traces 39 on the tape 37 with respective metal traces 33 on the inwardly facing steps such that metal traces 39 on the tape 37 can be appropriately electrically connected to metal traces 33 on the inwardly facing steps 13, for example by soldering. In particular, when the carrier 35 and the tape 37 attached thereto are placed on the inwardly facing steps 13 with the downwardly extending edges of the carrier engaged in the grooves 31, the metal traces 39 are laterally aligned with corresponding metal traces 33 on the inwardly facing steps 13.

In accordance with the invention, the steps 13 are formed by utilizing shorter ceramic tape layers for the layers that are above the steps while the grooves are formed by cutting or punching openings along corresponding edges of the ceramic tape layers in which the grooves are to be formed.

The foregoing has been a disclosure of embodiments of the invention which contemplates the inclusion in a co-fired unitized multilayer circuit substrate of indented or recessed features that are formed by individually punching or cutting edges of selected contiguously adjacent ceramic tape layers that ultimately form the portions of the unitized circuit that contain the indented or recessed features prior to lamination and sintering of the constituent ceramic tape layers. The invention advantageously facilitates the integration of unitized multilayer circuit structures into higher level assemblies while incurring only slight additional complexity in the fabrication of unitized multilayer circuit structures.

Although the foregoing has been a description and illustration of specific embodiments of the invention, various modifications and changes thereto can be made by persons skilled in the art without departing from the scope and spirit of the invention as defined by the following claims.

What is claimed is:

1. A unitized multilayer circuit structure comprising:

a plurality of planar dielectric insulating layers stacked in laminar fashion and integrally fused to form a unitized multilayer substrate having sides formed by edges of the dielectric insulating layers; and a recess formed respectively in one side of and opposite side of said substrate and extending partially into said substrate;

whereby the unitized multilayer circuit structure is secured to a higher level assembly by engagement of said recess by a fastener.

2. The unitized multilayer circuit structure of claim 1 wherein said recess is comprised of respective openings along edges of a plurality of contiguous ones of said plurality of dielectric insulating layers.

3. A unitized multilayer circuit structure comprising:

a first plurality of planar dielectric insulating layers stacked in laminar fashion and integrally fused to form a first unitized multilayer substrate having sides formed by edges of the dielectric insulating layers, said substrate having a top and a bottom;

a second plurality of planar dielectric insulating layers stacked in laminar fashion and integrally fused to form a second unitized multilayer substrate having sides formed by edges of the dielectric insulating layers, said substrate having a top and a bottom;

said first unitized multilayer substrate and said second unitized multilayer substrate being positioned such that a first side of said first unitized multilayer substrate is opposite a first side of said second unitized multilayer substrate;

a recess formed in said first side of said first unitized multilayer substrate, said recess extending into said first unitized multilayer substrate and being comprised of respective openings along edges of a plurality of contiguous ones of said first plurality of dielectric insulating layers;

a recess formed in said first side of said second unitized multilayer substrate, said recess extending into said second unitized multilayer substrate and being comprised of respective openings along edges of a plurality of contiguous ones of said second plurality of dielectric insulating layers; and fastening means engaged in said recess formed in said first side of said first unitized multilayer substrate and said recess formed in said first side of said second unitized multilayer substrate for securing said first unitized multilayer substrate and said second unitized multilayer substrate to an assembly.

4. The unitized multilayer circuit structure of claim 3 further including:

a step formed in the top of said first substrate adjacent said first side of said first substrate;

a step formed in the top of said second substrate adjacent one side of said first substrate and facing said step formed in the top of said first substrate; and a cover spanning said step formed in the top of said first substrate and said step formed in the top of said second substrate.

* * * * *